(12) United States Patent
Czubatyi et al.

(10) Patent No.: US 7,566,643 B2
(45) Date of Patent: Jul. 28, 2009

(54) LIQUID PHASE DEPOSITION OF CONTACTS IN PROGRAMMABLE RESISTANCE AND SWITCHING DEVICES

(75) Inventors: Wolodymyr Czubatyi, Warren, MI (US); Tyler Lowrey, Rochester Hills, MI (US); Ed Spall, Auburn Hills, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 68 days.

(21) Appl. No.: 11/880,587

(22) Filed: Jul. 23, 2007

(65) Prior Publication Data

US 2009/0029534 A1 Jan. 29, 2009

(51) Int. Cl.
*H01L 21/20* (2006.01)
(52) U.S. Cl. .................. 438/584; 438/540; 438/618; 438/633; 438/635; 438/638; 257/E21.174
(58) Field of Classification Search .............. 438/540, 438/635
See application file for complete search history.

(56) References Cited

U.S. PATENT DOCUMENTS

2002/0093901 A1* 7/2002 Davies et al. .......... 369/109.01
2003/0082356 A1* 5/2003 Suemasu et al. ............ 428/209

* cited by examiner

*Primary Examiner*—Wael Fahmy
*Assistant Examiner*—Kyoung Lee
(74) *Attorney, Agent, or Firm*—Kevin L. Bray

(57) ABSTRACT

A programmable resistance, chalcogenide, switching or phase-change material device includes a substrate with a plurality of stacked layers including a conducting bottom composite electrode layer, an insulative layer having an opening formed therein, an active material layer deposited over both the insulative layer and the bottom composite electrode, and a top electrode layer deposited over the active material layer. The device uses a chemical or electrochemical liquid phase deposition process to selectively and conformally fill the insulative layer opening with the conductive bottom composite electrode layer. Conformally filling the conductive material within the opening reduces structural irregularities within the opening thereby increasing material density and resistivity within the device and thereby improving device performance and reducing programming current.

37 Claims, 4 Drawing Sheets

LIQUID PHASE DEPOSITION OF CONTACTS IN PROGRAMMABLE RESISTANCE AND SWITCHING DEVICES

FIELD OF INVENTION

This invention relates generally to programmable resistance and switching devices having one or more electrical contacts with a lithographic or sublithographic dimension. More particularly, this invention relates to programmable resistance and switching device structures with contacts formed from solution-based deposition methods. Most particularly, this invention relates to programmable resistance and switching devices with sublithographic contacts having reduced structural irregularities, improved conformality, and reduced programming currents.

BACKGROUND OF THE INVENTION

Programmable resistance materials and fast switching materials are promising active materials for next-generation electronic storage, computing and signal transfer devices. A programmable resistance material possesses two or more states that differ in electrical resistance. The material can be programmed back and forth between the states by providing energy to the material to induce an internal transformation of the material that manifests itself as a change in resistance of the material. The different resistance states can be used to store or process data and the different resistance values of the resistance states can serve as identifying indicia of the states.

Fast switching materials are not based on programmable resistance change. They are, however, capable of being switched between a relatively resistive state, the quiescent low conduction state, and the highly conductive state. Application of an energy signal, typically an electrical energy signal, induces this change from the relatively resistive state to the relatively conductive state. The relatively conductive state persists for so long as the energy signal is applied. Once the energy signal is removed, the switching material relaxes back to its quiescent state. Devices that incorporate switching materials are useful as voltage clamping devices, surge suppression devices, signal routing devices, and access devices.

Phase change materials are a promising class of programmable resistance materials. A phase change material is a material that is capable of undergoing a transformation, preferably reversible, between two or more distinct structural states. In a common embodiment, a phase change material is reversibly transformable between a crystalline state and an amorphous state. In the crystalline state, the phase change material has low resistivity; while in the amorphous state, it has high resistivity. The distinct structural states of a phase change material may be distinguished on the basis of, for example, crystal structure, atomic arrangement, order or disorder, fractional crystallinity, relative proportions of two or more different structural states, a physical (e.g. electrical, optical, magnetic, mechanical) or chemical property etc. Reversibility of the transformations between structural states permits reuse of the material over multiple cycles of operation.

Typically, a programmable resistance material or switching device is formed by placing an active material, such as a phase change material, between two electrodes. Operation of the device is effected by providing an electrical signal between the two electrodes and across the active material. Programmable resistance materials may be used as the active material of a memory device. Write operations in a memory device, also called programming operations, which apply electric pulses to the memory device, and read operations, which measure the resistance of the memory device, are performed by providing current or voltage signals across the two electrodes. The transformation between the relative resistive state and relatively conductive state of a switching material is similarly induced by providing a current or voltage signal between two electrodes in contact with the switching material. One of the significant practical challenges that the programmable resistance memory and switching devices face is to reduce the contact area of one or more electrodes contacting the chalcogenide material. By reducing the contact area, the energy required to program a memory device or switch a switching device can be reduced and more efficient devices can be achieved.

Fabrication of semiconductor devices such as logic and memory devices typically includes a number of processes that may be used to form various features and multiple levels or layers of semiconductor devices on a surface of a semiconductor wafer or another appropriate substrate.

Physical (PVD) and chemical (CVD) vapor deposition methods, and also the deposition of conductive coatings through various decomposition processes of gaseous, liquid or solid precursors may be used in the formation of semiconductor devices.

Additionally, lithography is a process used in the formation of semiconductor devices that typically involves transferring a pattern to a resist arranged on a surface of a semiconductor wafer. Lithography is commonly used to define small-scale features of semiconductor devices and often sets a limit on the goal of device miniaturization.

Additional examples of semiconductor fabrication processes include chemical-mechanical polishing, etching, deposition, ion implantation, plating, and cleaning. Semiconductor devices are significantly smaller than a typical semiconductor wafer or substrate, and an array of semiconductor devices may be formed on a semiconductor wafer. After processing is complete, the semiconductor wafer may be separated into individual semiconductor devices.

In semiconductor device fabrication, it is desirable to reduce the length scale or feature size of devices as much as possible so that a larger number of devices can be formed on a given substrate area. As the feature size of devices is minimized, however, processing of the devices becomes more difficult. Small scale features become more difficult to define as the lithographic limit of resolution is reached and features that are defined become more difficult to process.

A common step in processing involves depositing a layer and forming an opening in it. Openings such as channels, trenches, holes, vias, pores or depressions in layers are commonly employed to permit interconnections between devices or layers of a structure. Typically, the opening is formed by lithography or etching and is subsequently filled with another material. As the dimension or length scale of an opening decreases upon miniaturization, it becomes increasingly difficult to satisfactorily fill the opening with another material.

Techniques such as physical vapor deposition (PVD) or sputtering fail to provide dense or complete filling of openings when the dimensions of the opening are reduced below a critical size. Instead of providing a dense, uniform filling, these techniques increasingly incompletely fill openings as the dimension of the opening decreases while the depth stays the same, thus increasing the aspect ratio. The deposited layer of material includes gaps, pores, or other unfilled regions. The packing density of material formed in the opening may vary in the depth or lateral dimensions of the opening.

Lack of structural uniformity in the filling of openings compromises device functionality as variations occur from device-to-device across an array of devices on a substrate. In addition, less than optimal performance is achieved for each device due to the defective nature of the deposited material. Imperfections in filling openings become especially pronounced as the aspect ratio (ratio of the dimension normal to the substrate to the dimension parallel to the substrate) of the opening increases. Deep, narrow channels, for example, are more difficult to uniformly fill than channels that are shallow and wide. With deep, narrow features, sputtering and other physical deposition techniques are oftentimes unable to deliver sufficient material to the bottom of the feature. Instead, a layer of material is formed over or only near the top of the feature and the lower part of the feature is blocked and remains largely unfilled.

Conformality of deposition is another processing difficulty that becomes exacerbated as feature size decreases. Fabrication of semiconductor devices generally involves forming a stack of layers, where the individual layers may differ in dimensions (lateral to or normal to the substrate) and compositions. The process of fabricating a semiconductor device generally involves sequential deposition of one layer upon a lower (previously formed) layer. Optimal device performance requires conformality of later formed layers with earlier formed layers. Each layer in a stack must conform to the shape and contours of the layer in the stack upon which it is formed. Smooth and uniform coverage is desired.

In addition to difficulties with achieving uniform filling, openings also present complications for achieving conformal deposition that become more pronounced as size of the opening decreases. The boundary or perimeter of an opening is frequently defined by an edge, step, or other relatively discontinuous feature. The shape of an opening is generally defined by a sidewall or perimeter boundary and a lower surface or bottom boundary. A trench opening, for example, is defined by generally vertical sidewalls and a bottom surface that is generally parallel to the substrate.

When fabricating semiconductor devices, it is often necessary to first form a layer with an opening and to subsequently deposit another layer over this layer. Conformality requires that the subsequent layer faithfully conform to the shape and texture of the underlying layer having the opening. The subsequent layer must deposit uniformly over both the portion of the underlying layer in which the opening has not been formed as well as over the opening itself. Conformality over the opening requires uniform coverage of the edges or steps that form the boundary of the opening. Achieving conformality over discontinuous features becomes increasingly difficult as the feature size of the opening decreases or the aspect ratio of the opening increases.

Fabrication of programmable resistance and switching devices often includes a step of forming an opening in a dielectric layer and filling the opening with a conductive material to form an electrical contact. Miniaturization of programmable resistance and switching devices requires methods for reducing the dimensions of the electrical contacts. Contacts with small dimensions are beneficial because the energy required to operate programmable resistance and switching devices decreases with decreasing contact size. Accordingly, it is desirable to develop techniques for forming and filling openings with small dimensions without suffering from the imperfections in filling and conformality associated with standard prior art techniques such as sputtering or physical vapor deposition. Ideally, the techniques would enable the fabrication of electrical contacts for programmable resistance and switching devices having dimensions near, at or below the lithographic limit.

Referring to the drawings, FIG. 1 depicts a representative structure of a phase change material device that illustrates the nature of imperfections that may form in an electrical contact having a sublithographic dimension when the contact is deposited via sputtering or physical vapor deposition. A conductive layer 106 is formed over a substrate 102. An insulative layer 110 having an opening formed therein is then formed over conductive layer 106. Lower electrical contact 128 is formed in the opening of insulative layer 110 using a sputtering or physical vapor deposition process. A layer of phase change material 114 is then deposited onto lower electrical contact 128 and a top electrode layer 116 is deposited over the phase change layer 114. Lower electrical contact 128 includes imperfections in the form of internal voids 120 and non-conformal region 112. The imperfections detract from device performance. The prevalence of the imperfections increases as aspect ratio of the opening increases.

Chemical Vapor Deposition (CVD) is one method available in the prior art for filling openings that is expected to remain effective as the feature size of the opening decreases. The molecular dimensions of the gas phase precursors used in CVD allow the precursors to enter small dimensional openings, where they subsequently react to form a relatively uniform layer. Although CVD in principle is a viable strategy for forming lithographic or sublithographic contacts in programmable resistance and switching devices, the technique is limited in practice because of the unavailability of gas phase precursors for a variety of desirable contact materials. In addition, the reaction conditions (e.g. high temperatures or plasma conditions) needed to react the precursors may damage other layers in the device structure. There is a need, therefore, for alternative methods of forming electrical contacts in openings having small dimensions.

To address these issues, chemical solution-based conformal deposition may be used to reduce structural irregularities in photolithographic and subphotolithographic structures, and to selectively fill openings with one or more desired materials thereby increasing the design flexibility and quality of the resulting devices.

SUMMARY OF THE INVENTION

The instant invention provides electronic devices having logic, memory, switching, or processing functionality based on programmable resistance materials, switching materials or other active materials and methods of fabricating same.

In accordance with one embodiment of the instant invention, a programmable resistance or switching device includes a substrate with a plurality of stacked layers including a conducting bottom composite electrode layer, an insulative layer having an opening formed therein, a chalcogenide layer deposited over both the insulative layer and the bottom composite electrode, and a top electrode layer deposited over the chalcogenide layer.

In accordance with one embodiment of the instant invention, a programmable resistance material or switching material deposition is performed utilizing a chemical solution-based deposition process to selectively and conformally fill the insulative layer opening to the conductive bottom composite electrode layer. Conformally filling the conductive material within the opening reduces structural irregularities within the opening thereby increasing material density and resistivity within the device and thereby reducing programming current.

For a better understanding of the instant invention, together with other and further illustrative objects thereof, reference is made to the following description, taken in conjunction with the accompanying drawings and claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATED EMBODIMENTS

Figure 1:
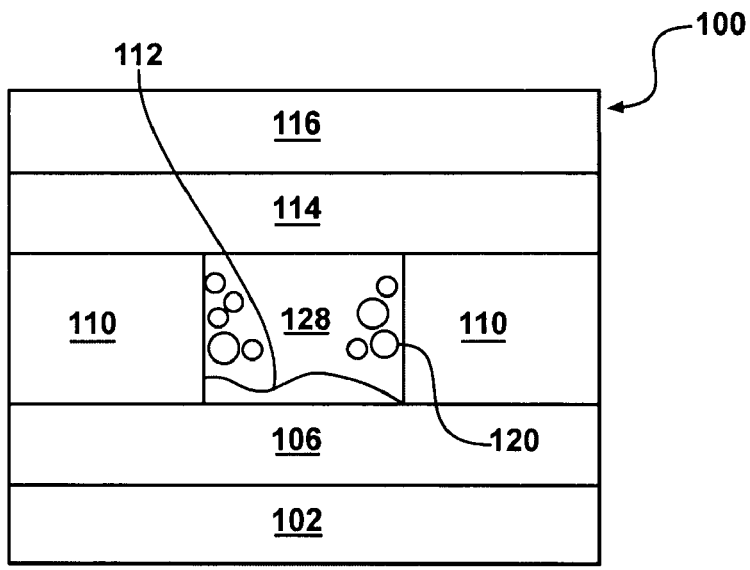
FIG. 1 is a schematic depiction of a conventional two-terminal electronic device having defects in an opening region of the two terminal device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a novel electronic device including an active material in accordance with the instant invention are illustrated in FIGS. 2 through 9. Throughout the various views and illustrative embodiments of the instant invention, like reference numbers are used to designate like elements.

As used herein, active material refers generally to an electrically stimulable material such as a programmable resistance material or an electrical switching material. A programmable resistance material is a material having two or more states that are distinguishable on the basis of electrical resistance. The two or more states may be structural states, chemical states, electrical states, optical states, magnetic states, or a combination thereof. A programmable resistance material is transformable ("programmable") between any pair of states by supplying an appropriate amount of energy to the material. The supplied energy may be referred to as a "programming energy". When transformed ("programmed") to a particular state, the programmable resistance material remains in that state until additional energy is supplied to the material. The different states of a programmable resistance material are stable in the absence of external energy and persist for an appreciable amount of time upon removal of the source of programming energy. Programmable resistance materials include phase-change materials, chalcogenide materials, pnictide materials, and other multi-resistance state materials.

Phase change materials include materials that are transformable between two or more crystallographically-distinct structural states. The states may differ in crystal structure, unit cell geometry, unit cell dimensions, degree of disorder, particle size, grain size, or composition. Chalcogenide materials are materials that include an element from Column VI of the periodic table as a significant component along with one or more modifying elements from Columns III, IV, or V of the periodic table. Pnictide materials are materials that include an element from Column V of the periodic table as a significant component along with one or more modifying elements from Columns III, IV, or VI of the periodic table. Other multi-resistance state materials include metal-insulator-metal structures with thin film insulators. Programmable resistance materials may serve as the active material in memory devices, including non-volatile memory devices. Representative programmable resistance materials in accordance with the instant invention are described in U.S. Pat. Nos. 6,967,344; 6,969,867; 7,020,006; and references cited therein; all of which disclosures are incorporated by reference herein.

Electrical switching materials are materials that are switchable between two states that differ in electrical conductivity. The two states range in conductivity from the relatively resistive (e.g. comparable to a dielectric) to the relatively conductive (e.g. comparable to a metal). Electrical switching materials generally have a quiescent or relaxed state, usually a relatively resistive state, in which they exist in the absence of electrical energy. When electrical energy is applied, the switching material transforms to a more conductive state and persists in that state transitorily for so long as it is subjected to a critical amount of energy from an external source. When the external energy decreases below the critical level, the switching material relaxes back to its quiescent state. Switching materials include OTS (Ovonic Threshold Switch) materials, negative differential resistance materials, and metal-insulator-metal structures. Certain chalcogenide and pnictide compositions also exhibit electrical switching. Illustrative switching materials include those described in U.S. Pat. Nos. 6,967, 344 and 6,969,867 incorporated by reference hereinabove.

Figure 2:
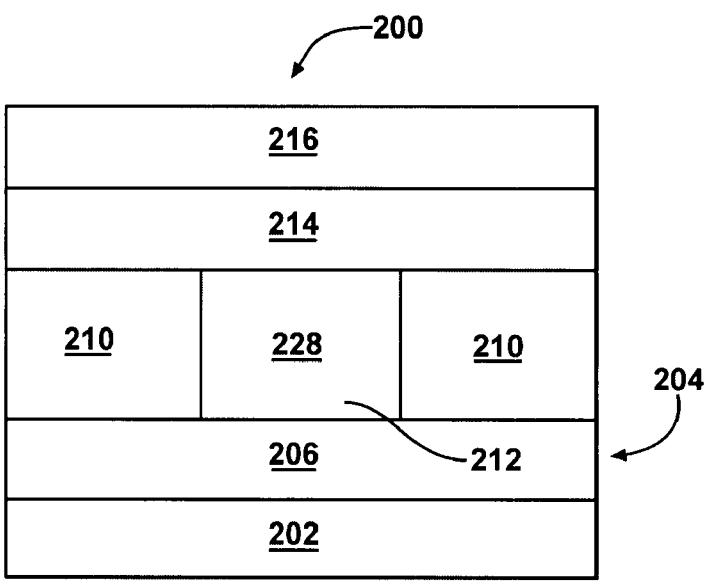
FIG. 2 illustrates a composite structure of an electronic device with an active material layer having a conductive bottom composite electrode that conformally and uniformly fills an insulator through a chemical solution-based deposition process.

FIG. 2 illustrates a composite structure of an active material device 200 having lithographic or sublithographic device contacts, where the active material is a phase change material. The process of the instant invention may be used to form a 2- or a 3-terminal structure, wherein photolithography can be used to define the outer boundaries of the material device.

The main part of the composite structure 200 is formed as stacked layers on a substrate 202 as is shown in FIG. 2. The substrate 202 may be a silicon substrate or a substrate comprising other semiconductor materials and may include access devices, power devices, or other electronic circuitry. The stacked layers comprise a conductive bottom composite electrode 204 formed from a lower contact layer 206 and an upper selectively deposited layer 228, an insulative layer 210 having an opening 212 formed therein thereby exposing the lower contact layer 206, a chalcogenide layer 214, and a top electrode layer 216.

Figure 3:
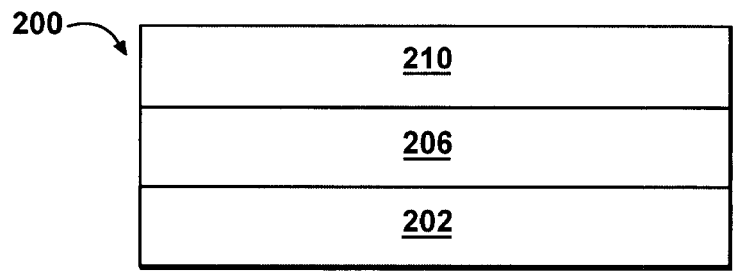
FIG. 3 illustrates a partial cross-sectional view of an electronic device with an active material layer including a substrate and a first stacked conductive lower contact layer, and a second stacked insulative layer on the deposited conductive first stacked lower control layer.
Figure 4:
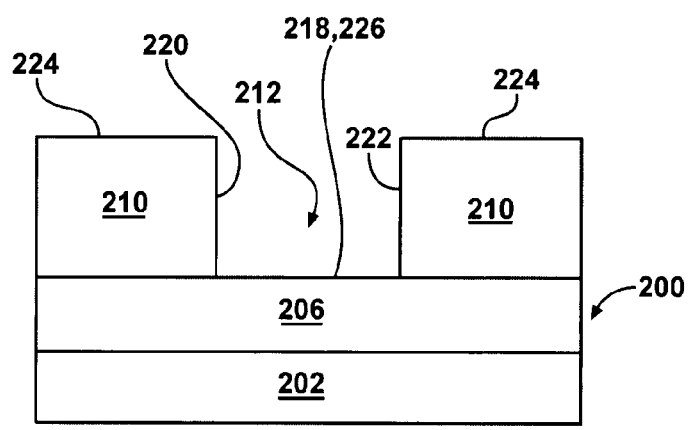
FIG. 4 is a schematic depiction of the electronic device shown in FIG. 3 having a photolithographically formed opening within the insulative layer.

FIG. 3 shows cross sectional views of the lower portion of composite structure 200. The lower contact layer 206 is formed on a substrate 202, and the insulative layer 210 deposited on the lower contact layer 206. The opening 212 in insulative layer 210 is formed thereby exposing a portion 218 of the lower contact layer 206 as shown in FIG. 4. The opening 212 is then selectively filled with one or more conductive materials, wherein the lower contact layer 206 and the upper selectively deposited layer 228 cooperate to form the bottom composite electrode 204, illustrated in FIG. 6. Upper selectively deposited layer 228 may be a single homogeneous layer of conductive material or a combination of two or more sublayers differing in composition. Once the opening 212 is filled, a chalcogenide or other active material layer 214 is deposited over the upper surfaces of insulative layer 210 and upper selectively deposited layer 228, and a top electrode layer 216 is formed on top of the chalcogenide material layer 214.

In an embodiment of the instant invention, as shown in FIGS. 3-4, the insulative and lower contact layers 210, 206, respectively, are formed sequentially over the substrate 202 by conventional physical vapor deposition (PVD, such as sputtering) or chemical vapor deposition (CVD). The lower contact layer 206 forms a lower layer of the bottom composite electrode 204.

The insulative layer 210 formed over the lower contact layer 206 electrically insulates the device features that will be subsequently formed. The insulative layer 210 may comprise an oxide such as silicon oxide, silicon nitride, or other dielectric materials.

Openings 212 are formed having a predefined depth, width, and shape. Representative openings include pores, vias, trenches, holes, or channels. The openings may be formed in the insulative layer 210 by patterning the insulative layer 210 and using photolithography and etching to form an opening 212 of each device in an array of devices formed on substrate 202 and thereby expose selected portions 218 of the lower contact layer 206, as illustrated in FIG. 4.

Each opening 212 may be filled using a solution-based conformal deposition process to conformally cover a portion of, or the entire opening 212.

The insulative layer 210 and the selectively exposed portions 218 of the lower contact layer 206 cooperate to define the dimensions of the opening 212, wherein vertically oriented portions of the insulative layer 210 form sidewalls 220, 222 of the opening 212 extending from an upper surface 224 of the insulative layer 210 to the selectively exposed portion 218 of the lower contact layer 206, and wherein a horizontally oriented selectively exposed portion 218 of the lower contact layer 206 forms a bottom 226 of the opening 212.

In an embodiment of the invention, the width or lateral dimension of the opening 212 is at the lithographic limit. In another embodiment, the width or lateral dimension of the opening 212 is sublithographic. The lithographic limit is a feature size or physical dimension limit imposed by photolithographic processing capabilities normally attributable to a limit on the ability to reduce the wavelength of the light source used to pattern or segment features during processing. According to the current technology roadmap, the feature size limit for flash technology is 65 nm (NOR)/57 nm (NAND). As processing techniques improve, the feature size limit will decrease in the future to further the goal of miniaturization. The projected feature size limit is 45 nm (NOR)/40 nm (NAND) in 2010 and 32 nm (NOR)/28 nm (NAND) in 2013. The methods described herein for forming contacts will scale with equal efficacy as the feature size limit decreases in the future.

In one embodiment, the width or lateral dimension of the opening 212 is less than 1000 Å. In another embodiment, the width or lateral dimension of the opening 212 is less than 500 Å. In yet another embodiment, the width or lateral dimension of the opening 212 is less than 200 Å. The width or lateral dimension of the opening 212 is generally the physical dimension of the opening in a direction parallel to the substrate 202. In FIG. 4, for example, the width or lateral dimension is the distance between sidewall 220 and sidewall 222. When the shape of the opening is round, the lateral dimension may be the diameter or the equivalent thereof of the opening.

The aspect ratio of the opening 212 may be defined as the ratio of the height or normal dimension of the opening to the width or lateral dimension of the opening. The height or normal dimension of the opening 212 is generally the physical dimension of the opening perpendicular to the substrate 202. In FIG. 4, for example, the height or normal dimension of the opening 212 corresponds to the thickness of insulative layer 210.

In one embodiment of the instant invention, height or normal dimension of the opening 212 is at least 100 Å. In another embodiment of the instant invention, height or normal dimension of the opening 212 is at least 500 Å. In yet another embodiment of the instant invention, height or normal dimension of the opening 212 is at least 1000 Å.

In one embodiment of the instant invention, the aspect ratio of the opening 212 is at least 1:1. In another embodiment of the instant invention, the aspect ratio of the opening 212 is at least 3:1. In yet another embodiment of the instant invention, the aspect ratio of the opening 212 is at least 5:1.

It is to be understood that the width or lateral dimensions, height or normal dimensions, and aspect ratios of the opening 212 as disclosed herein are illustrative only and are not intended to limit the scope of the opening's dimensions, wherein the dimensions of the opening may vary from the dimensions disclosed herein as required by the device structure.

In one embodiment of the invention, the opening 212 may be filled with conductive materials such as metals or other materials such as a chalcogenide material that thereby effectively vertically raises the lower composite electrode 204 within the opening 212 from the opening bottom 226 upwardly towards the upper surface 224 of the insulative layer 210 for dense packing of materials within the opening 212.

To form the bottom composite electrode 204, the selectively deposited layer 228 is conductive and is selectively deposited over the selectively exposed portions 218 of the lower contact layer 206. In one embodiment, the lower contact layer 206 forms a bottom conductive line such as a word or a bitline that may be connected to an external power supply to provide energy to device structure 200.

In an embodiment of the instant invention, the lower contact layer 206 has good adhesion to both the conducting selectively deposited layer 228 and to the insulative layer 210. Generally, a metal or any conductive material that is amenable to adhering to a selectively deposited material is suitable for forming the lower contact layer 206.

In an embodiment of the instant invention, the lower contact layer materials may include TiAlN, TiSiN, TaN, MoN, TiN, CTiN, or a combination thereof. In alternative embodiments, carbon or carbon-containing materials, and crystalline materials may be used.

In another embodiment of the instant invention, the lower contact layer 206 may be formed of conductive materials such as aluminum and preferably includes conductive metal compounds or materials, metal nitrides, metal chelates, organometallic compounds, or combinations thereof.

In one embodiment of the instant invention, the lower contact is formed of materials such as Ti, TiW, or combinations thereof. The lower contact layer 206 may include materials with resistive properties, such as TiN, TiSiN, TiAlN, tungsten (W), or molybdenum.

In an embodiment of the instant invention, the lower contact layer 206 may be formed with materials such as refractory metals, which are a class of metals extraordinarily resistant to heat, wear, and corrosion. The refractory metals may include tungsten (W), molybdenum (Mo), niobium (Nb), tantalum (Ta), or rhenium (Re) and may be made resistive by combining the metals with nitrides such as TiN or silicides such as TiSiN.

In an embodiment of the instant invention wherein the lower contact layer includes a conductor formed of physical layer deposition, the resistivity of the lower contact layer 206 may be adjusted by changing the nitrogen-to-metal ratio. A greater nitrogen concentration will result in an increase in the resistivity. Alternatively or additionally, the resistivity of the lower contact layer 206 may be adjusted by changing the silicon-to-metal ratio. A greater silicon concentration will result in an increase in the resistivity.

If a sputtering process is used to form the lower contact layer 206, then materials such as Al, Ti or other metals may combine with nitrogen or oxygen in a reactive sputtering process, thereby making the contact more resistive.

Once the exposed portion 218 of the lower contact layer 206 is formed, the conducting selectively deposited layer 228 is then conformally deposited over the exposed portion 218 of the lower contact layer 206. The selectively deposited material is deposited over the lower contact layer 206 in a manner that the selectively deposited layer 228 conformally follows the topography of the opening in the insulating layer 210 to the lower contact layer 206, including "dipping" into the opening and electrically contacting the selected exposed portions 218 of the lower contact layer 206.

The selectively deposited layer 228 forms in opening 212 and contacts lower contact layer 206 and sidewalls 220 and 222. In one embodiment, the selectively deposited material 228 preferentially deposits on a metal or a conductive material. In another embodiment, the selectively deposited material 228 preferentially deposits on lower conductive layer 206 relative to sidewalls 220 and 222. This embodiment is advantageous because the formation of the selectively deposited material 228 initiates at the bottom 226 of opening 212 instead of along the sidewalls 220 and 222. Initiation at the bottom 226 facilitates the complete filling of opening 212 and prevents blockage of opening 212 that may occur if initiation of the formation of selectively deposited material 228 occurs along the sidewalls 220 and 222.

Thus, each small opening 212 in the insulative layer 210 may be filled by selectively depositing the selectively deposited conductive layer 228 on the lower contact layer 206 at the bottom 206 of the insulative layer opening 212.

The material 228 is selectively deposited upon the lower contact layer 206 and may include any material that dissolves in solution or is capable of plating or depositing from a solution in a chemical or electrochemical process.

The type of selectively deposited materials may vary depending upon the lower level conductive material selected. In one embodiment of the instant invention, a conductive material such as a metal selectively deposited on the lower contact layer 206 may not be the same metal or material that forms the lower contact layer 206.

In an embodiment of the instant invention, the material used to form the selectively deposited layer 228 has a same charge as the lower contact layer material when in solution.

In an embodiment of the instant invention, the selectively deposited material has a resistivity that allows for a voltage drop across the selectively deposited layer during device operation and preferably has an electrical resistivity equal to or greater than the resistivity of the lower contact layer 206.

In an embodiment of the instant invention, the resistivity of the selectively deposited layer 228 is one or more orders higher than the resistivity of the lower contact layer 206, so that the selectively deposited layer 228 acts as a heater while significantly less heat is generated in the lower contact layer 206.

In an embodiment of the instant invention, the selectively deposited layer 228 may also be referred to as a heater or heating electrode. The heater is resistive so the heater can drop voltage across the heater to allow the heater to heat, thereby increasing the temperature in the active region of device 200 and effectively lowering the programming current required to program the device 200 by channeling the programming current through a small contact area. In one embodiment, the contact area has a lithographic dimension and in another embodiment, the contact area has a sublithographic dimension.

To increase resistivity and promote efficient local heating, more conductive metals (e.g. Ni, Cu, or Ag) may be combined with more resistant materials to increase the resistivity. The instant invention contemplates the simultaneous or sequential deposition of two or more metals from a solution disposed within the opening 212 on lower conductor 206. The two or more metals may co-deposit as an alloy, as a layered or alternating stack, or as interspersed or agglomerated regions within the opening 212.

In another embodiment of the instant invention, conductive materials such as tellurium (Te) or oxidized variations of tantalum may be selectively deposited to allow a tunneling current to pass from lower conductor layer 206 through the selectively deposited layer 228.

Additionally, any class of coordination or complex compounds consisting of a central metal atom attached to a large molecule, called a ligand, in a cyclic or ring structure that chelate to metals, such as ethylene derivatives, oxalates, acetylacetonates, and related complexes, may be used in a selective deposition process to form the selectively deposited layer 228.

In one embodiment of the instant invention, the selectively deposited material is deposited within the opening 212 and onto the bottom 226 of the opening 212, i.e., the selectively exposed portion 218 of the lower level contact layer 206 using a solution-based deposition process such as a wet chemical deposition process, e.g., through electrolytic or electro-less aqueous solution plating of metals or chalcogenide materials to the exposed portion 218 of the lower contact layer 206.

Deposition chemistries are chosen so that the conductor deposition is preferably deposited on the exposed portion 218 of the lower contact layer 206 at the bottom 226 of the insulative layer opening 212, and not on the insulative layer 210.

Electroplating provides a deposition option, wherein solutions containing ions of desired readily available conductors may be deposited into small or sublithographic openings, and wherein the openings are typically very difficult to fill by conventional PVD or sputtering processes without forming structural irregularities.

Chemistries that prefer deposition on the lower contact layer material at the bottom 226 of the opening 212 in the insulative layer 210 instead of to the insulator materials are chosen in accordance with a desired material to be selectively deposited on the selectively exposed lower contact layer 218.

Figure 5:
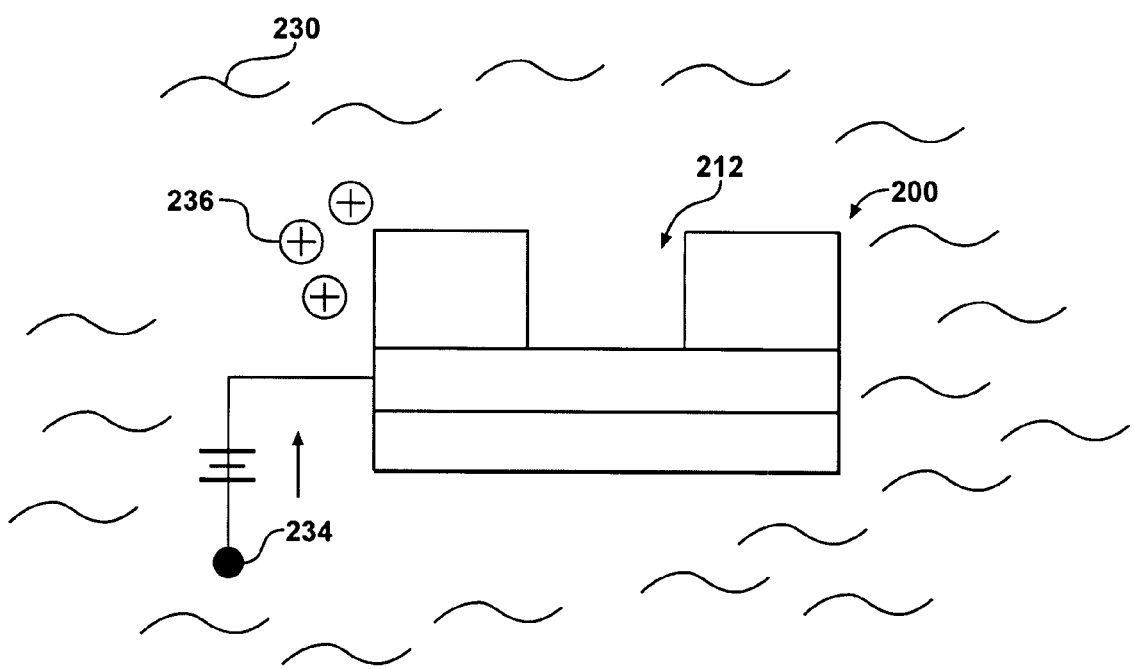
FIG. 5 is a schematic depiction of an electroplating process used to selectively form a conductive bottom composite layer.

Initially, the composite structure 200 is immersed in an ionic electroplating solution 230 and capillary action causes the solution to fill the opening 212 as shown in FIG. 5.

In particular, the structure is placed in a wet chemical solution containing ions 236 of the material to be selectively deposited, an external current I is applied, and the conductive material is deposited onto the lower contact layer.

As shown in FIG. 5, in an electroplating process in accordance with an embodiment of the instant invention, the composite structure 200 is placed in a wet chemical solution 230 containing conductive ions 236 of the material to be deposited. An electrical potential is applied between the lower contact layer 206 on the substrate 202 and a counter electrode 234 in the liquid to induce electroplating of the ions 236 to the exposed portion 218 of the lower contact layer 206.

The conductive material is then deposited within the opening 212 of the composite structure 200 using the electrolytic plating technique. In the electroplating process, ions of the selectively deposited material 228 are reduced in an electrochemical reaction to their neutral or metallic state and deposit on lower contact layer 206, which may function as the cathode in the reaction. Oxidation occurs at the counterelectrode 234. The general reduction half-reaction for the process may be written:

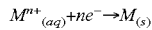
$$M^{n+}_{(aq)} + ne^- \rightarrow M_{(s)}$$

where $M^{n+}$ is the dissolved or solution phase form of M, the material 228 that is being selectively deposited in opening 212. As indicated hereinabove, M is generally a conductive material such as a metal, including a transition metal. The dissolved species $M^{n+}$ has oxidation state $n^+$, where n is an integer. The dissolved species may be an uncomplexed ion $M^{n+}$ as shown in the reaction above (or a hydrated form thereof) or a complexed ion $ML_x^{n+}$, where L is a ligand coordinated to M. L may be an inorganic ligand (e.g. halide, nitrate, perchlorate, sulfate) or an organic ligand (e.g. amine or other nitrogen-coordinating ligand or oxalate or other oxygen-coordinating ligand, including monodentate, bidentate, polydentate, cyclic or macrocyclic ligands).

The lower contact layer 206 may serve has an active or inactive electrode in the electroplating process. If an active electrode, lower contact layer 206 may become oxidized in the electroplating process and partially dissolve in the surrounding solution as the selectively deposited material forms. If an inactive electrode, lower contact layer 206 remains intact during the electroplating process.

In one embodiment of the invention, the electrical potential is varied over time (pulsed or cycled) to improve the uniformity of the deposition.

Figure 9:
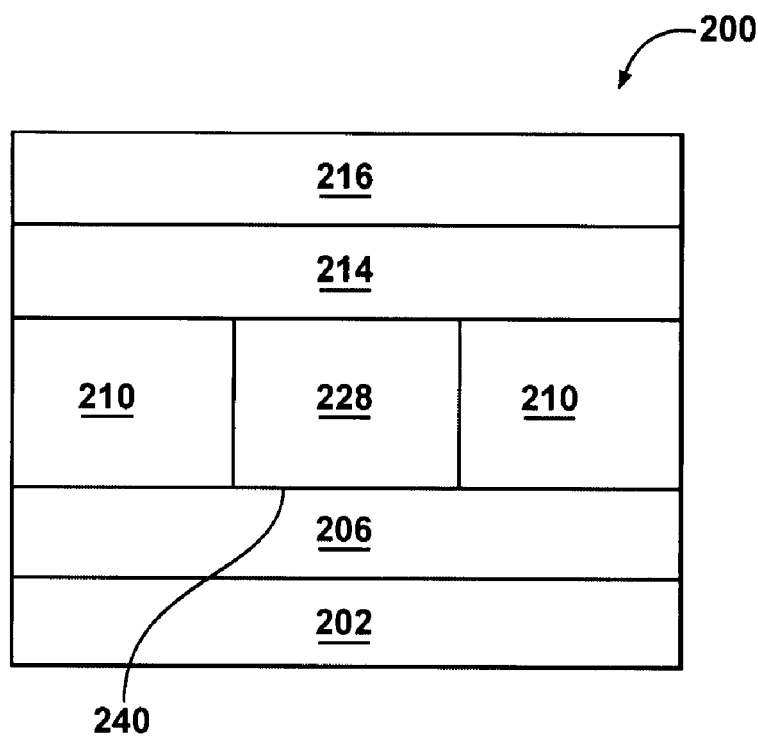
FIG. 9 is a schematic depiction of the electronic device shown in FIG. 6 having an active material layer deposited thereon.

If the lower contact layer 206 and the conductive selectively deposited material both have the same composition, as the conductive selectively deposited material deposits on to the lower contact layer, the interface 240, illustrated in FIG. 9, between the lower contact layer 206 and the selectively deposited layer 228 may become smooth, with the lower contact layer 206 and the selectively deposited layer 228 forming an integrated bottom composite electrode 204 (see FIG. 2).

Figure 6:
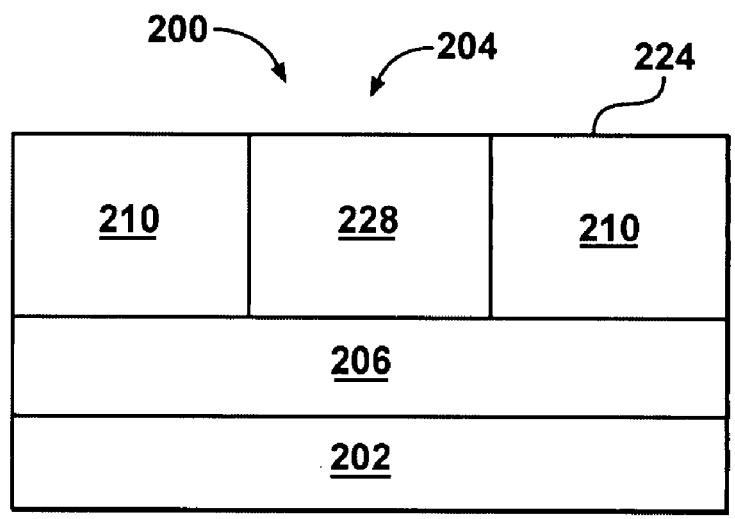
FIG. 6 illustrates a partial cross-sectional view of an electronic device with an active material layer having a planarized selectively deposited layer and a planarized insulative layer.

FIG. 6 shows a composite bottom electrode 204 having the selectively deposited layer 228 electroplated to the exposed portion 218 of the lower contact layer 206, wherein the selectively deposited layer 228 forms a heater. The plating solution 230 filled the opening 212 when the current was applied for a predefined time to deposit a conductive selectively deposited material.

The thickness of the selectively deposited layer 228 is proportional to the length of time that the current is applied to the structure 200 immersed in or coated with the plating solution 230.

Additionally, applied voltages may be adjusted as desired to change the thermodynamic energy barriers of the ions in solution so that the ions can form a compound on the exposed portions 218 of the lower contact layer 206.

In one embodiment of the instant invention, the electroplating process time may range between one or more seconds to several minutes, depending on the desired thickness of the selectively deposited layer 228. Electrolytic plating generally provides more precise control over the rate of deposition of ions of the selectively deposited materials than that of electroless deposition processes.

Figure 7:
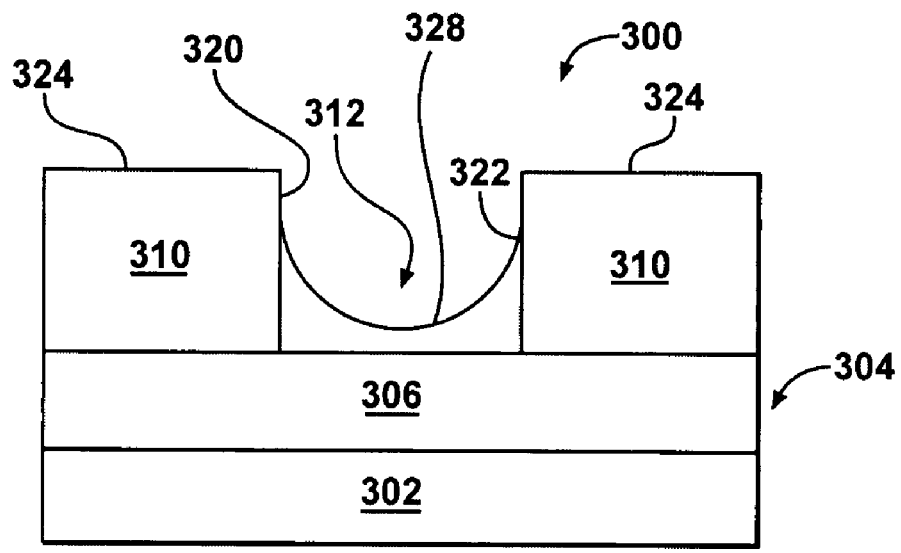
FIG. 7 illustrates a partial cross-sectional view of an electronic device with an active material layer having a thin film heater selectively deposited within an opening formed within an insulative layer.

Similarly, FIG. 7 shows the result of a selective deposition of a heater 328 on the lower metal contact wordline. A relatively short time was used to form the thin selectively deposited layer 328 or heater shown in FIG. 7.

In an embodiment of the instant invention, shown in FIG. 7, a device structure 300 is fabricated similarly to device structure 200 having corresponding stacked layers on a substrate 302, wherein the stacked layers include a lower contact layer 306, an insulative layer 310 having an opening 312, and a selectively deposited layer 328, and a bottom composite electrode 304 formed by the lower contact layer 306 and the selectively deposited layer 328. The bottom composite electrode layer 304 has a lesser thickness than the greater thickness shown in FIG. 8 and will not extend completely to an upper surface 324 of the insulative layer 310.

Figure 8:
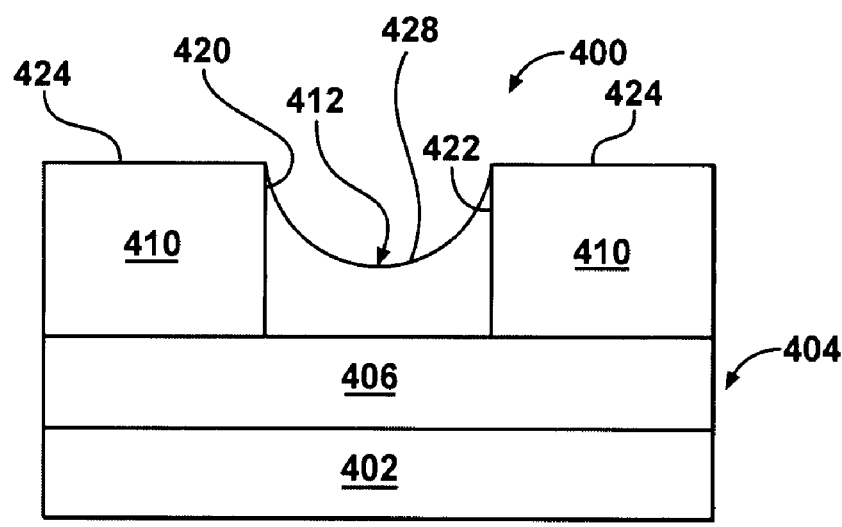
FIG. 8 illustrates a partial cross-sectional view of an electronic device with an active material layer having a thick film heater selectively deposited within an opening formed within an insulative layer.

FIG. 8 shows a larger heater 428 formed by a longer deposition time than the deposition time used to form the thinner heater shown in FIG. 7. The embodiment of the instant invention shown in FIG. 8 is a cross sectional view of a device structure 400 fabricated similarly to the device structure 200 having corresponding stacked layers formed on a substrate 402, wherein the stacked layers include a lower contact layer 406, an insulative layer 410 having an opening 412, and a selectively deposited layer 428, and a bottom composite electrode 404 formed by the lower contact layer 406 and the selectively deposited layer 428. The bottom composite electrode layer 404 having a greater thickness will extend from the opening bottom 418 to an upper surface 424 of the insulative layer 410 formed by an opening bottom 418 and sidewalls 420, 422.

Extending the time of electroplating beyond the time associated with the embodiment of FIG. 8 permits complete filling of the opening 412. Overfilling of the opening may also occur and the excess material may be removed in a subsequent planarization or chemical-mechanical processing step.

In a further embodiment, electroplating may be used to selectively deposit two or more materials within opening 312 of FIG. 7 or opening 412 of FIG. 8. Once selectively deposited layer 328 of FIG. 7 or 428 of FIG. 8 are formed, one may remove the device 300 or the device 400 from the initial plating solution and immerse or coat it with a second plating solution containing a second dissolved material that can be selectively deposited on top of the layer 328 of FIG. 7 or layer 428 of FIG. 8. By repeating this process, selective deposition of a multilayer stack can be achieved within opening 312 or opening 412. Alternatively, a particular plating solution may include two or more materials that may co-deposit within opening 312 or 412 during electroplating.

Referring again to FIGS. 2-4 in another embodiment of the instant invention, the selectively deposited layer 228 may be deposited using an electro-less plating technique, which does not require the application of an externally applied current. Electro-less plating is a chemical deposition process whereby the selectively deposited material undergoes a reduction reaction in the solution phase to form a neutral product that deposits as a solid on the lower contact 206. Electro-less plating may occur, for example, through an acid-base or spontaneous oxidation-reduction reaction.

The electro-less plating process provides concentrations of ions and solutions that cause solid particles to selectively deposit on the selectively exposed portions 218 of the lower contact layer 206. Adjustments of the chemistries such as the pH levels of the solution, may be made to control the deposition rate of the selectively deposited material.

In one embodiment of the instant invention selective deposition of tungsten or carbon occur In another embodiment of the instant invention, other conductive materials such as aluminum, silver, tin, lead, nickel, chromium, cobalt, copper, other transition metals, or combinations thereof may be selectively deposited to the lower contact layer 206 through a lithographic or sublithographic opening in an insulator.

Once the electrochemically or chemically induced deposition is complete, the solution within the circuit feature is removed using conventional techniques, such as washing the substrate in an organic solvent, evaporation, or performing a dry plasma etch, etc.

FIG. 6 illustrates a cross sectional view of the structure 200 wherein the opening 212 is completely filled either by electroplating or chemical selective deposition. After deposition of the composite electrode and after the chemical solution is removed from the device 200, the device 200 is then planarized or polished down to an upper surface 224 of the bottom electrode 204 and the upper surface 224 of the of the insulative layer 210.

As shown in FIG. 9, after the planarization process, the balance of the device 200 may be formed including sequential formation of the active material layer 214 and the top electrode layer 216, which are each fabricated by conventional deposition techniques (e.g. sputtering, physical vapor deposition, or chemical vapor deposition). The active material layer 214 may include phase change material, chalcogenide material, programmable resistance material, threshold switching material, or a combination thereof.

Chalcogenide materials are an embodiment of phase change materials in accordance with the instant invention. Chalcogenide materials have been previously utilized in data processing, optical, electrical material and switching applications and some representative compositions and properties have been discussed in U.S. Pat. Nos. 5,543,737; 5,694,146; 5,757,446; 5,166,758; 5,296,716; 5,534,711; 5,536,947; 5,596,522; 6,087,674; and 7,186,998; the disclosures of which are hereby incorporated in their entireties by reference herein, as well as in several journal articles including "Reversible Electrical Switching Phenomena in Disordered Structures", Physical Review Letters, vol. 21, p. 1450 1453 (1968) by S. R. Ovshinsky "Amorphous Semiconductors for Switching, Material, and Imaging Applications", IEEE Transactions on Electron Devices, vol. ED-20, p. 91 105 (1973) by S. R. Ovshinsky and H. Fritzsche; the disclosures of which are hereby incorporated by reference herein.

As shown in FIG. 2, the top electrode layer 216 is formed over the chalcogenide layer 214. In an embodiment of the instant invention, the top electrode layer 216 may be formed of the same or different materials than the materials used to form the composite electrode. However, it is preferable that the top electrode layer 216 have a lower resistivity than that of the bottom composite electrode layer 204 to promote localized heating mostly from the bottom composite electrode 204. Conformally filling the opening 212 within the insulative layer 210 with conductive material to a desired depth within the opening 212 operates to densely pack the conductive material within the opening and thereby reduce structural irregularities within the opening. Increasing material density within the opening may also increase the resistivity of the composite electrode layer, which in turn operates to reduce programming current of the device.

The results have shown that with proper materials and design, the programming current density can be significantly reduced.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure and knowledge commonly available to persons of skill in the art, which define the scope of the instant invention.

We claim:

1. A method of forming an electronic device, comprising:
providing a liquid, said liquid comprising a dissolved cation;
reacting said liquid to form a solid material, said solid material comprising said cation; and
forming an active material over said solid material, said active material being selected from the group consisting of programmable resistance materials, electronic switching materials, chalcogenide materials, phase-change materials, and pnictide materials.

2. The method of claim 1, wherein said reaction of said liquid reduces said cation, said solid material including said reduced cation.

3. The method of claim 1, wherein said cation is a metal cation.

4. A method of forming an electronic device, comprising:
providing a liquid;
reacting said liquid to form a solid material, said solid material comprising a metal and nitrogen; and
forming an active material over said solid material, said active material being selected from the group consisting of programmable resistance materials, electronic switching materials, chalcogenide materials, phase-change materials, and pnictide materials.

5. The method of claim 3, wherein said metal is a transition metal.

6. A method of forming an electronic device, comprising:
providing a liquid;
reacting said liquid to form a solid material, said solid material comprising carbon; and
forming an active material over said solid material, said active material being selected from the group consisting of programmable resistance materials, electronic switching materials, chalcogenide materials, phase-change materials, and pnictide materials.

7. The method of claim 1, wherein said active material comprises Te and Ge.

8. The method of claim 1, wherein said active material contacts said solid material.

9. The method of claim 1, wherein said active material is a programmable resistance material.

10. The method of claim 1, wherein said active material is transformable among a plurality of structural states.

11. The method of claim 10, wherein said structural states include a crystalline state and an amorphous state.

12. A method of forming an electronic device, comprising:
providing a first liquid;
reacting said first liquid to form a first solid material; and
forming an active material over said first solid material, said active material being selected from the group consisting of programmable resistance materials, electronic switching materials, chalcogenide materials, phase-change materials, and pnictide materials;
providing a second liquid; and
reacting said second liquid to form a second solid material, said second solid material forming over said first solid material.

13. The method of claim 12, wherein said second solid material is interposed between said first solid material and said active material.

14. The method of claim 1, further comprising:
forming a conductive layer over said active material.

15. A method of forming an electronic device, comprising:
providing a substrate;
forming an insulative layer on said substrate;
forming an opening in said insulative layer, said opening having a bottom and a sidewall;
providing a first liquid;
reacting said first liquid to form a first solid material; and
forming an active material over said first solid material, said active material being selected from the group consisting of programmable resistance materials, electronic switching materials, chalcogenide materials, phase-change materials, and pnictide materials;
wherein said providing first liquid step includes the step of introducing said first liquid into said opening and said reacting first liquid step includes the step of forming said first solid material in said opening.

16. The method of claim 15, wherein a dimension of said opening is at the lithographic limit.

17. The method of claim 15, wherein a dimension of said opening is sublithographic.

18. The method of claim 15, wherein a dimension of said opening is less than 1000 Å.

19. The method of claim 15, wherein a dimension of said opening is less than 500 Å.

20. The method of claim 15, wherein said opening has an aspect ratio of at least 1:1.

21. The method of claim 15, wherein said opening has an aspect ratio of at least 5:1.

22. The method of claim 15, wherein said first solid material completely fills said opening.

23. The method of claim 15, wherein said first solid material forms conformally on a portion of said bottom of said opening.

24. The method of claim 15, wherein said first solid material forms conformally on a portion of said sidewall of said opening.

25. The method of claim 15, wherein said first solid material forms more quickly on said bottom of said opening than on said sidewall of said opening.

26. The method of claim 15, further comprising:
providing a second liquid;
reacting said second liquid to form a second solid material, said second solid material forming over said first solid material; said second solid material forming in said opening.

27. The method of claim 15, further comprising:
forming a first conductive layer between said substrate and said insulative layer.

28. The method of claim 27, wherein the bottom of said opening contacts said first conductive layer.

29. The method of claim 28, wherein said first solid material contacts said first conductive layer.

30. The method of claim 15, wherein said first solid material comprises a metal.

31. The method of claim 30, wherein said metal is a transition metal.

32. The method of claim 15, wherein said active material comprises Te along with Ge or Sb.

33. The method of claim 15, further comprising forming a conductive layer over said active material.

34. The method of claim 4, wherein said metal is a transition metal.

35. The method of claim 12, wherein said first solid material comprises a metal.

36. The method of claim 35, wherein said metal is a transition metal.

37. The method of claim 12, wherein said active material comprises Te along with Ge or Sb.

* * * * *